(12) United States Patent
Lee et al.

(10) Patent No.: US 12,514,024 B2
(45) Date of Patent: Dec. 30, 2025

(54) METHODS FOR IMPROVING LIGHT SENSOR RESPONSE

(71) Applicant: Taiwan Semiconductor Manufacturing Company, Hsinchu (TW)

(72) Inventors: Meng-Ju Lee, Taoyuan (TW); Hao-Ming Liu, Hsinchu (TW); Shengyi Wang, Miaoli (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 428 days.

(21) Appl. No.: 18/093,217

(22) Filed: Jan. 4, 2023

(65) Prior Publication Data

US 2024/0079504 A1     Mar. 7, 2024

Related U.S. Application Data

(60) Provisional application No. 63/403,906, filed on Sep. 6, 2022.

(51) Int. Cl.
| | | |
|---|---|---|
| H10F 77/30 | (2025.01) | |
| H10F 39/00 | (2025.01) | |
| H10F 71/00 | (2025.01) | |
| H10F 30/22 | (2025.01) | |

(52) U.S. Cl.
CPC ......... H10F 77/306 (2025.01); H10F 39/024 (2025.01); H10F 39/805 (2025.01); H10F 71/00 (2025.01); H10F 30/22 (2025.01)

(58) Field of Classification Search
CPC ..... H10F 39/805; H10F 39/024; H10F 39/014
See application file for complete search history.

(56) References Cited

U.S. PATENT DOCUMENTS

| | | | | |
|---|---|---|---|---|
| 7,879,639 | B2* | 2/2011 | Ko | H10F 39/014 |
| | | | | 257/292 |
| 8,368,130 | B2* | 2/2013 | Ko | H10F 39/803 |
| | | | | 257/292 |
| 8,709,854 | B2* | 4/2014 | Chuang | H10F 39/182 |
| | | | | 438/57 |
| 8,969,991 | B2* | 3/2015 | Chuang | H10F 77/306 |
| | | | | 257/447 |
| 9,305,966 | B2* | 4/2016 | Chuang | H10F 39/811 |
| 9,490,294 | B2* | 11/2016 | Yamamoto | H10F 39/813 |
| 9,576,999 | B2* | 2/2017 | Chuang | H10F 39/8057 |
| 9,837,464 | B2* | 12/2017 | Chuang | H10F 39/024 |
| 11,538,844 | B2* | 12/2022 | Chen | H10F 39/8037 |
| 2007/0072326 | A1* | 3/2007 | Zheng | H10F 77/337 |
| | | | | 257/292 |
| 2008/0251821 | A1* | 10/2008 | Ko | H10F 39/803 |
| | | | | 257/292 |
| 2011/0133260 | A1* | 6/2011 | Ko | H10F 39/803 |
| | | | | 257/292 |

(Continued)

*Primary Examiner* — Mounir S Amer
*Assistant Examiner* — Alexander Belousov
(74) *Attorney, Agent, or Firm* — Lippes Mathias LLP

(57) ABSTRACT

A photodiode with improved response, particular in the blue light portion of the spectrum, is disclosed. An oxide window is formed adjacent a silicide junction. An etch stop layer is applied over the silicide junction, and the oxide window is then etched to form a thin film. A nitride layer is then applied. The resulting photodiode has increased transmission of blue light.

20 Claims, 19 Drawing Sheets

(56) References Cited

U.S. PATENT DOCUMENTS

| | | | |
|---|---|---|---|
| 2013/0299886 A1* | 11/2013 | Chuang | H10F 39/811 |
| | | | 257/292 |
| 2014/0159190 A1* | 6/2014 | Chuang | H10F 71/129 |
| | | | 257/447 |
| 2016/0079305 A1* | 3/2016 | Yamamoto | H10F 39/18 |
| | | | 438/59 |
| 2021/0217798 A1* | 7/2021 | Chen | H01L 23/53295 |
| 2024/0079504 A1* | 3/2024 | Lee | H10F 77/306 |
| 2025/0241080 A1* | 7/2025 | Liu | H10F 39/014 |

\* cited by examiner

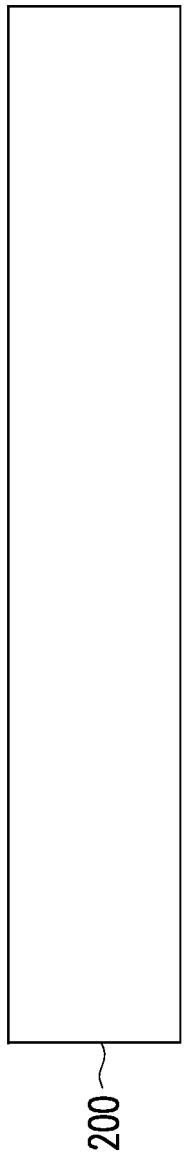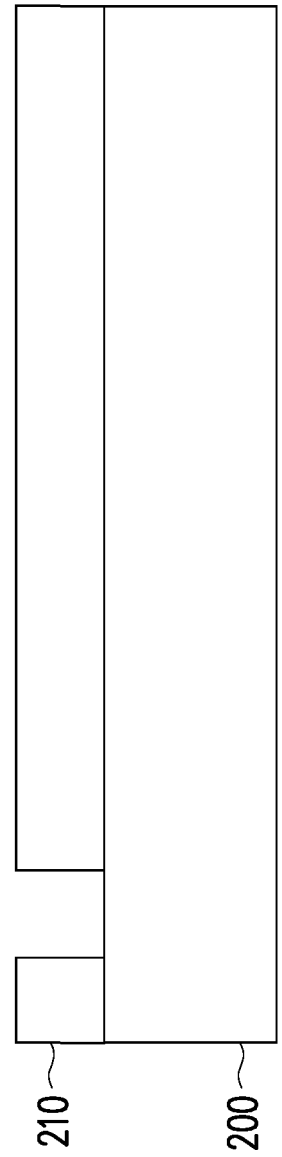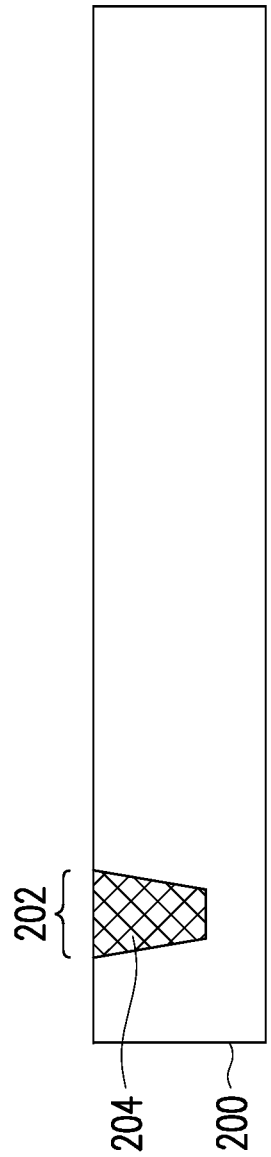

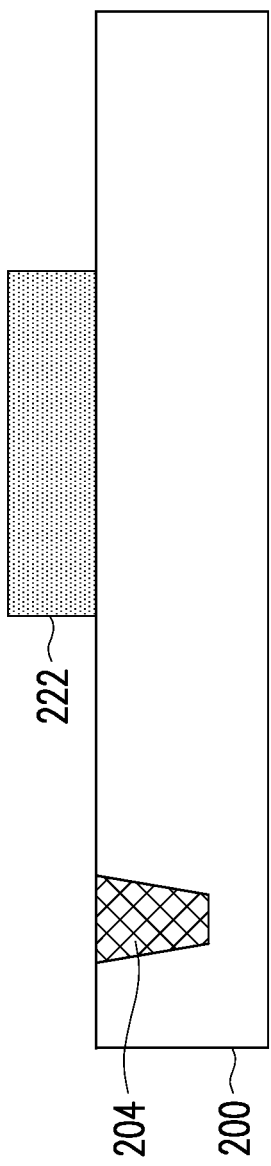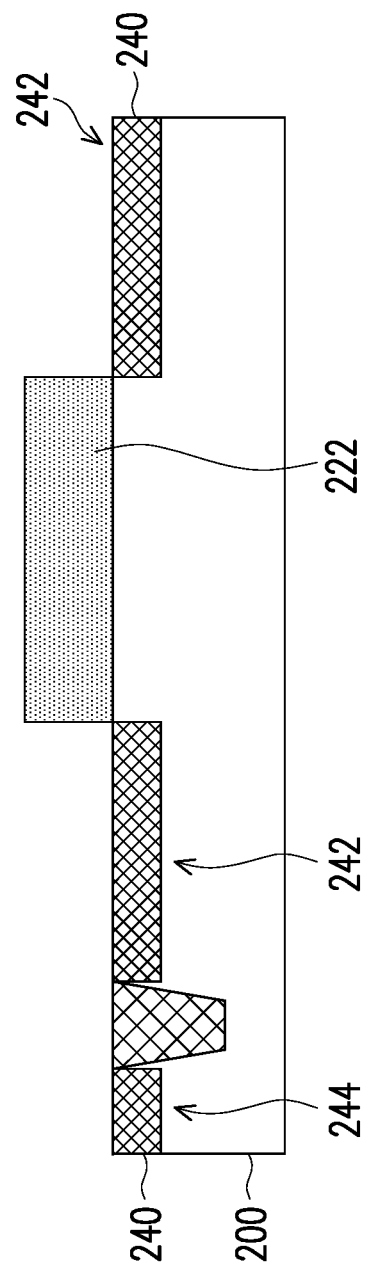

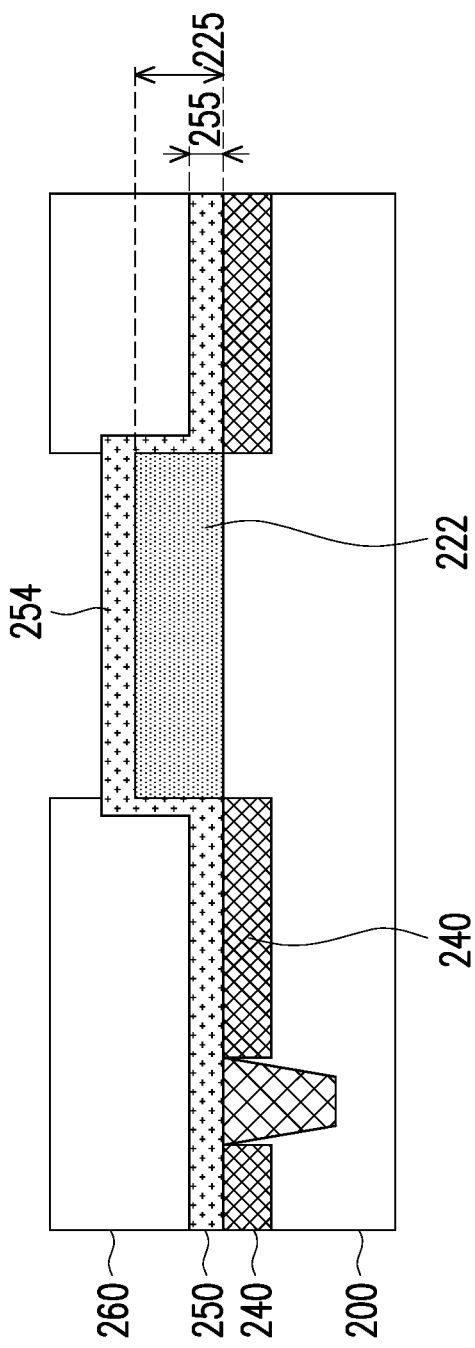
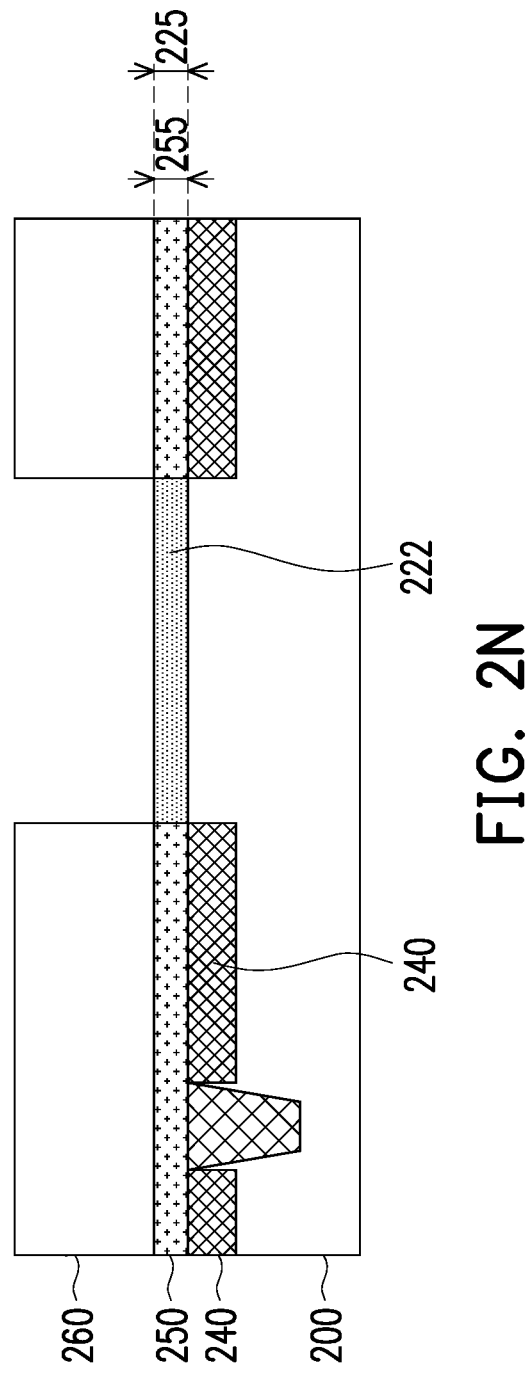

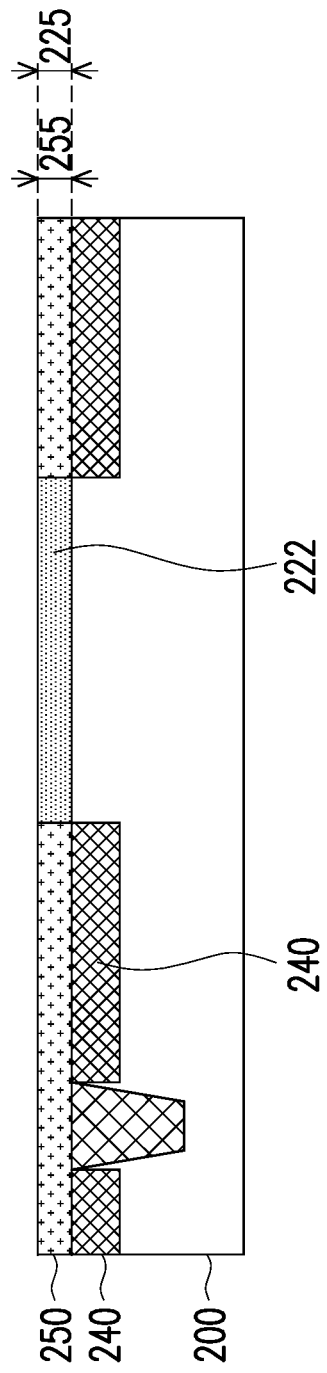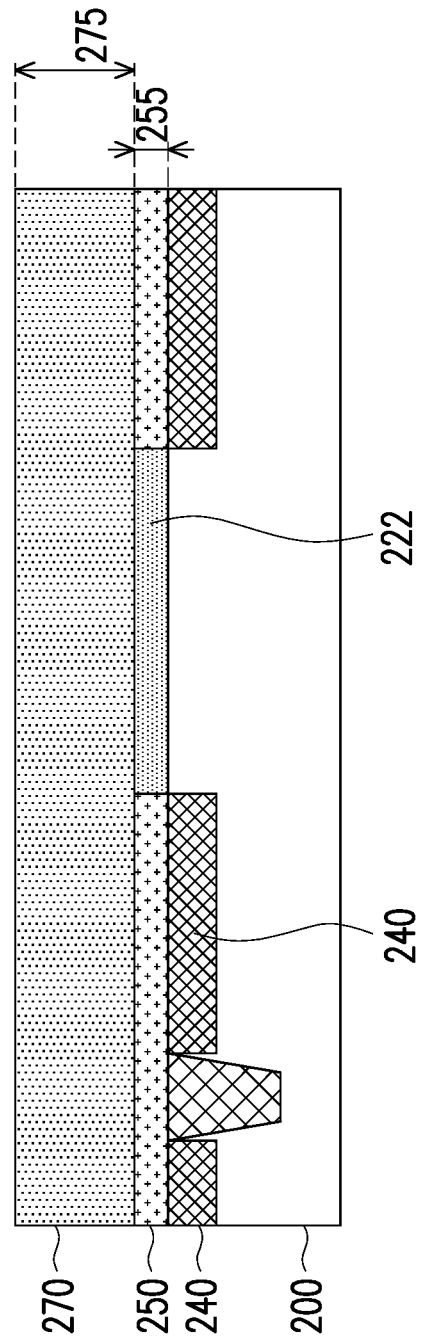

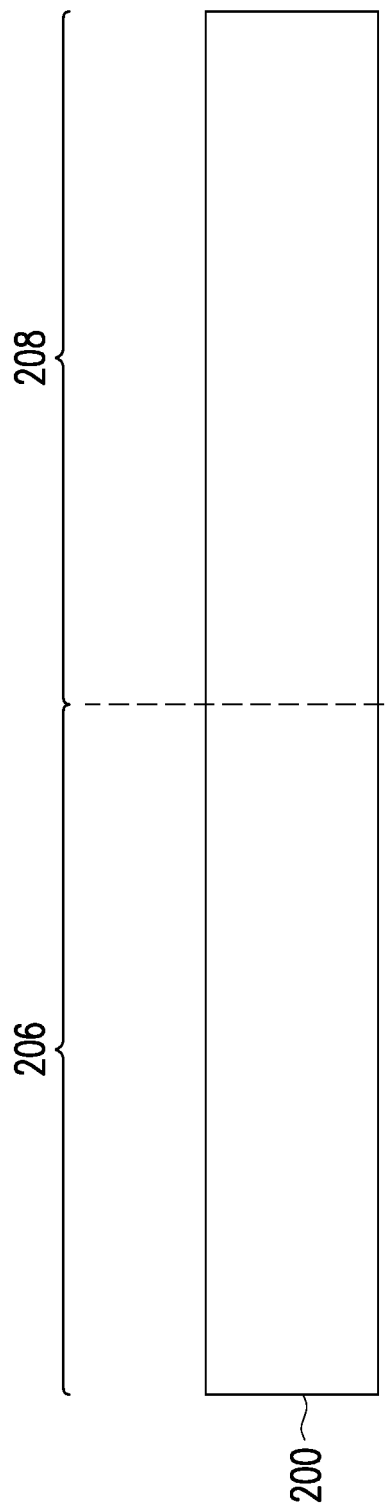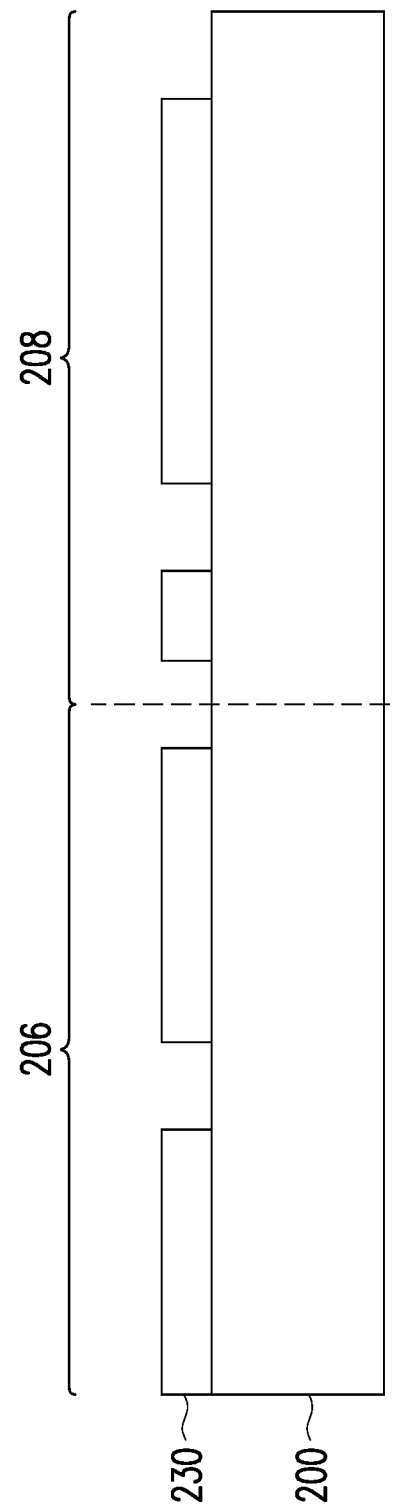

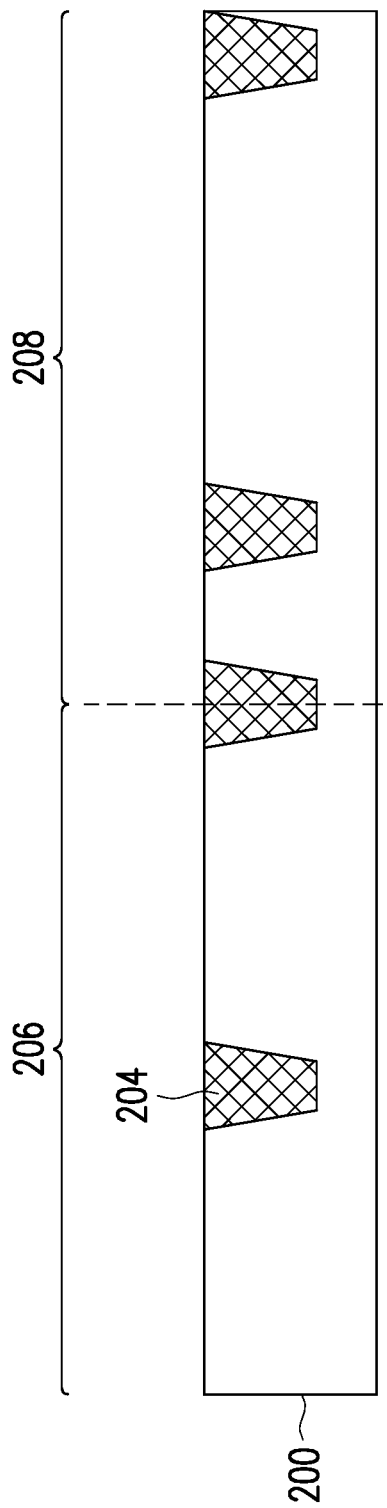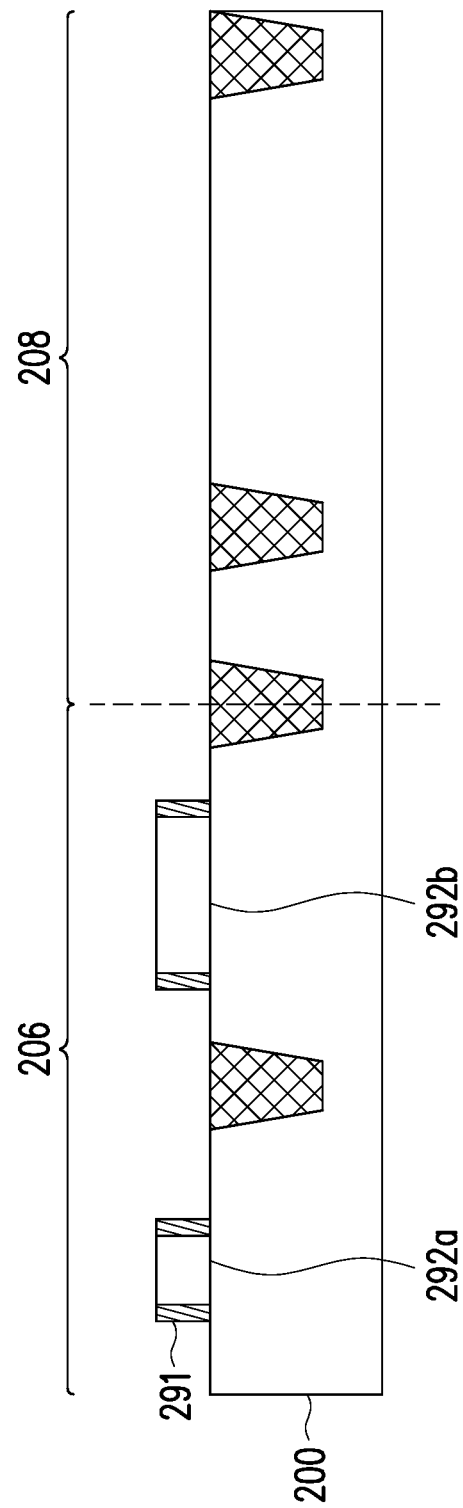

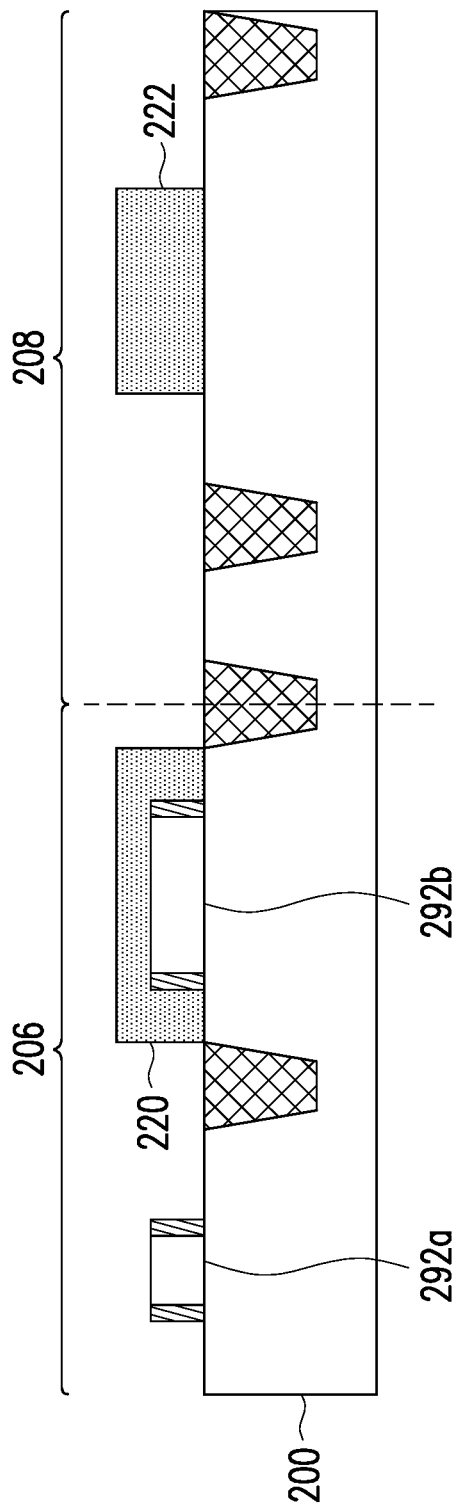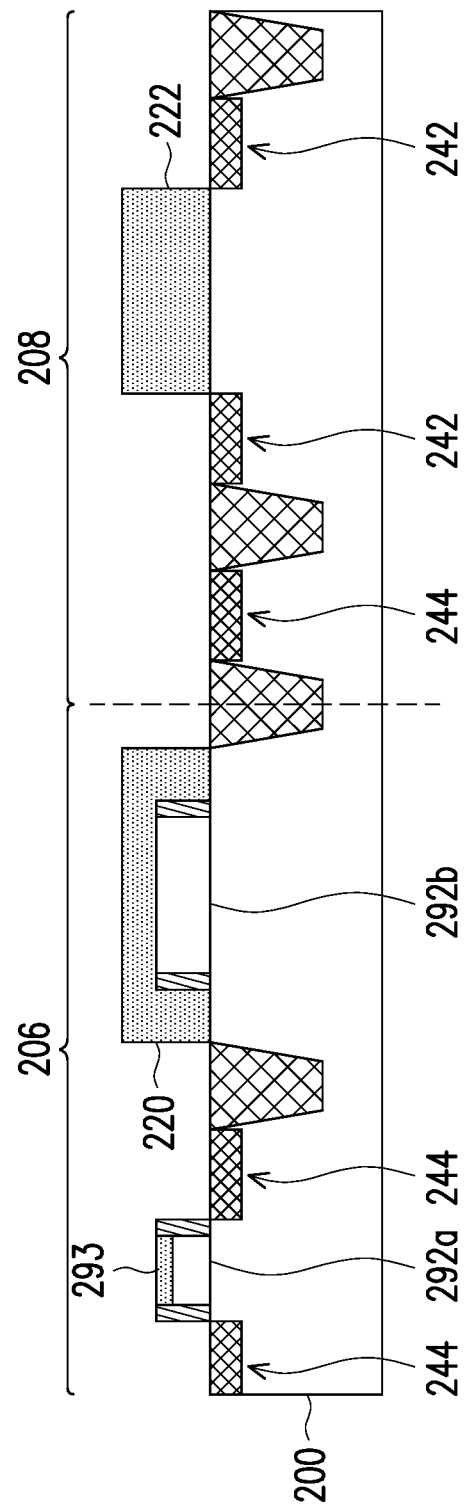

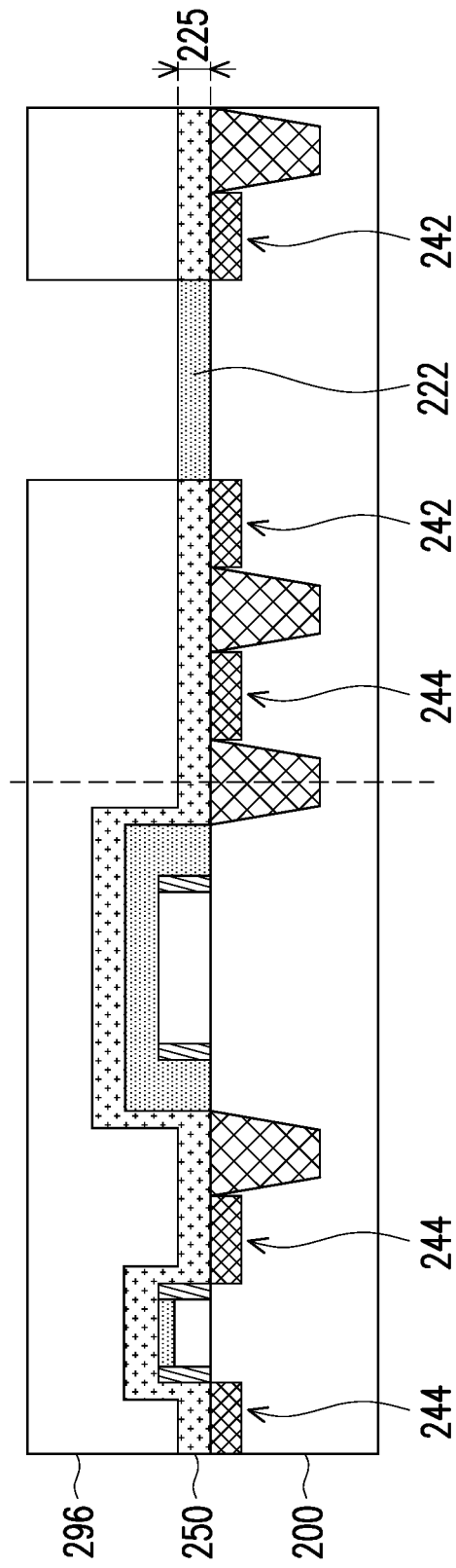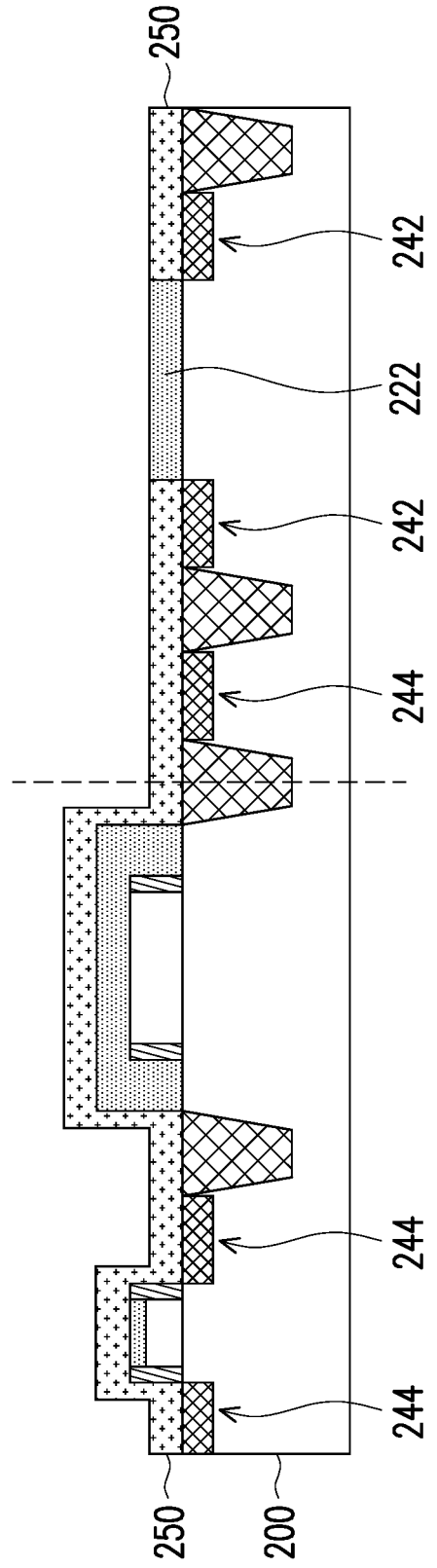

METHODS FOR IMPROVING LIGHT SENSOR RESPONSE

CROSS-REFERENCE TO RELATED APPLICATIONS

This application claims priority to U.S. Provisional Patent Application Ser. No. 63/403,906, filed on Sep. 6, 2022, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Different structures such as transistors, pressure sensors, and micro-electromechanical systems can be constructed on the wafer substrate.

As specifications for light sensors become stricter due to less available space and a desired for increased resolution/efficiency, the actual light signal itself can become difficult to detect, for example when the photodiode(s) of a light sensor are placed behind other components. In addition, blue light (about 450 nm to about 485 nm wavelength) is made up of short wavelengths, and thus is more difficult to detect due to reflectivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4K are cross-sectional diagrams illustrating various steps of the method of FIG. 3.

DETAILED DESCRIPTION

Figure 1:
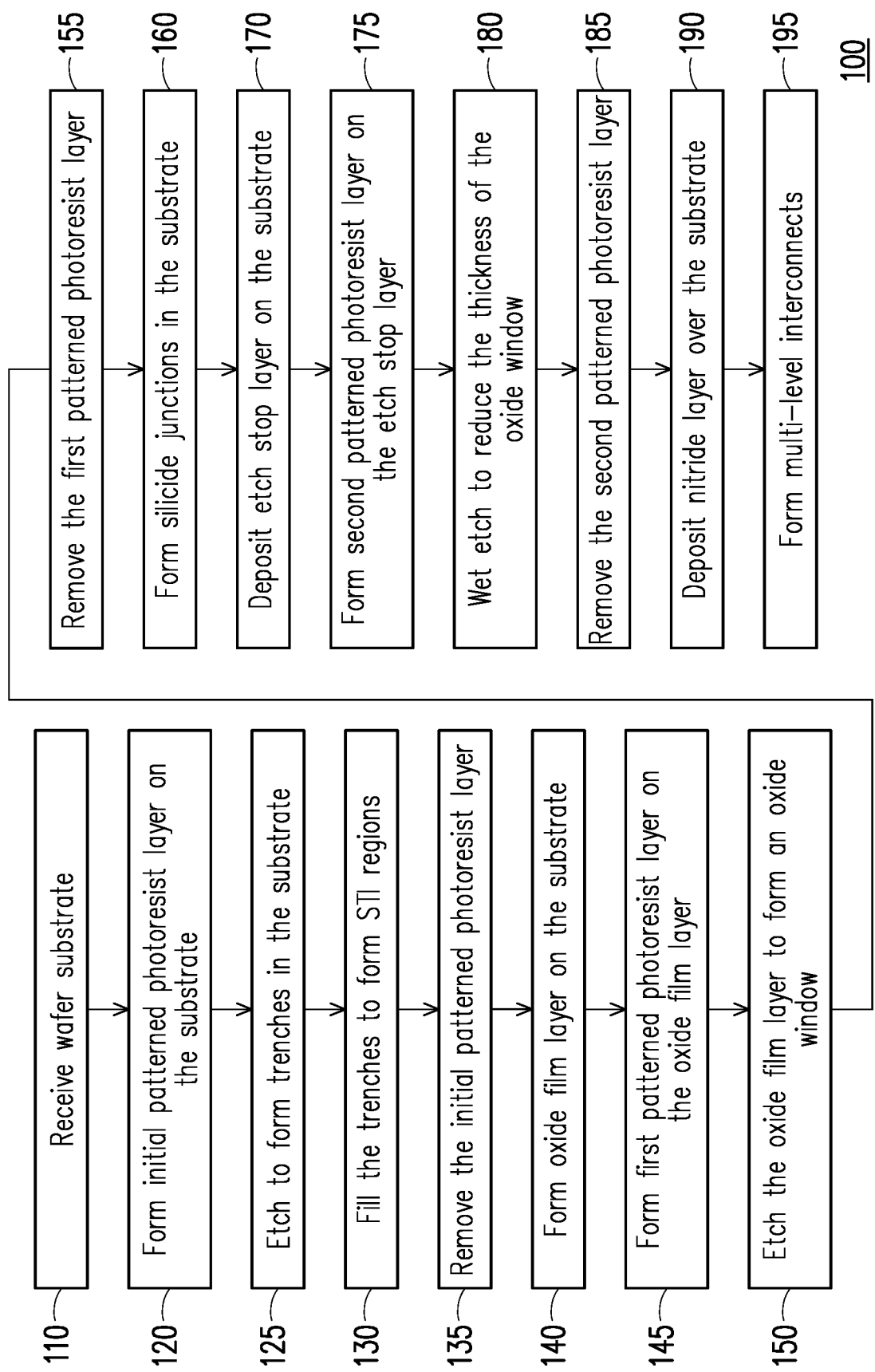
FIG. 1 is a flow chart illustrating a method for preparing a light sensor and improving the spectrum response of a photodiode, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them.

The present disclosure relates to methods and systems for improving the detection of blue light in a photodiode which is present in a light sensor and which is prepared via photolithography. Such light sensors can include charge coupled devices (CCDs), complementary metal-oxide semiconductor (CMOS) image sensors, contact image sensors (CIS), and ambient light sensors (ALS) which are used in systems such as mobile telephones, facial recognition systems, or as motion sensors for automotive applications, security applications, energy efficiency, etc. In particular embodiments, the light sensor is a CMOS sensor, which typically requires lower voltage, consumes less power, enables random access, and can be fabricated with conventional photolithography processes when compared to CCDs.

FIG. 1 is a flow chart illustrating a method 100 for preparing a light sensor and improving the spectrum response of a photodiode. Some steps of the method are also illustrated in FIGS. 2A-2Q. These figures illustrate a photodiode area of the light sensor. The light sensor also includes a logic area (not shown), which can receive signals from multiple photodiode areas.

Initially, as seen in FIG. 2A, in step 110, a wafer substrate 200 is received or provided. The wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon.

Referring now to FIG. 1 and FIG. 2B, in step 120, an initial patterned photoresist layer 210 is made upon the substrate 200. A photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist is then applied to the center of the substrate. The speed of the rotating platen is then increased to spread the photoresist evenly from the center of the substrate to the perimeter of the substrate. The rotating speed of the platen is then fixed, which can control the thickness of the final photoresist layer. The photoresist can be baked or cured to remove the solvent and harden the photoresist layer.

The photoresist is then exposed to patterned light, and then developed to obtain the initial patterned photoresist layer. The mask which is used to pattern the photoresist layer may have a different structure depending on whether positive photoresist or negative photoresist is used. In a positive photoresist, the regions exposed to light will be dissolved by the developer, leaving a coating where the mask was placed. In a negative photoresist, the regions exposed to light are strengthened (fox example by cross-linking), and the regions not exposed to light will be dissolved by the developer, leaving a coating in the area exposed by the mask. The initial patterned photoresist layer is illustrated in FIG. 2B. Typically, negative photoresist is used. In particular embodiments, extreme ultraviolet (EUV) light having a wavelength of about 13.5 nm is used for patterning, as this permits smaller feature sizes to be obtained.

Next, with reference to FIG. 2C, in step 125, etching is performed through the first patterned photoresist layer down into the substrate 200 to form trenches 202. The substrate can be wet etched or dry etched, using suitable etchants. Then, in step 130, the trenches are filled with a dielectric material to form a shallow trench isolation (STI) region 204. The dielectric material in the STI region is commonly a silicon oxide, although other dielectric materials can also be used such as undoped polysilicon, silicon nitride, silicon oxynitride, fluoride-doped silicate glass, or other dielectric material. The deposition can be done using physical vapor deposition (PVD) or chemical vapor deposition (CVD) or spin-on processes known in the art, or can be grown via oxidation. In step 135, the initial patterned photoresist layer is then removed. The resulting structure is illustrated in FIG. 2C.

Figure 2D:
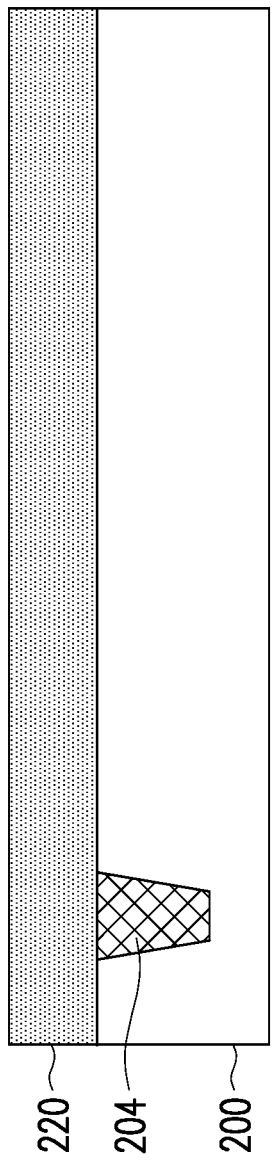
FIGS. 2A-2Q are cross-sectional diagrams illustrating various steps of the method of FIG. 1.

Referring now to FIG. 1 and FIG. 2D, in step 140, an oxide film layer 220 is formed on the substrate. This layer may be formed using processes such as thermal oxidation, atomic layer deposition (ALD) or chemical vapor deposition (CVD), including plasma-enhanced atomic layer deposition (PEALD) or plasma-enhanced chemical vapor deposition (PECVD). For example, the oxide film layer can be formed from a silicon oxide ($SiO_x$, $0 < x \leq 2$) such as silicon dioxide ($SiO_2$).

Figure 2E:
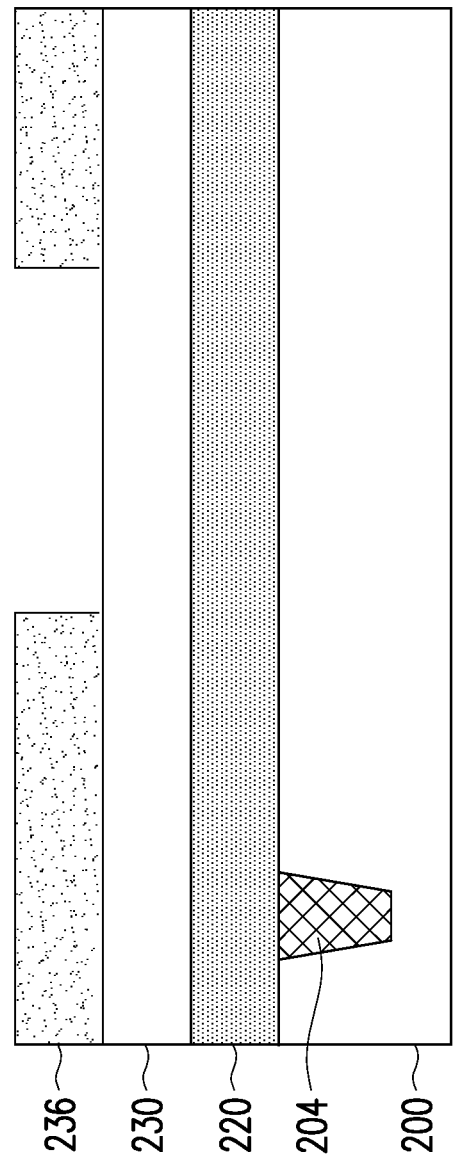
Figure 2F:
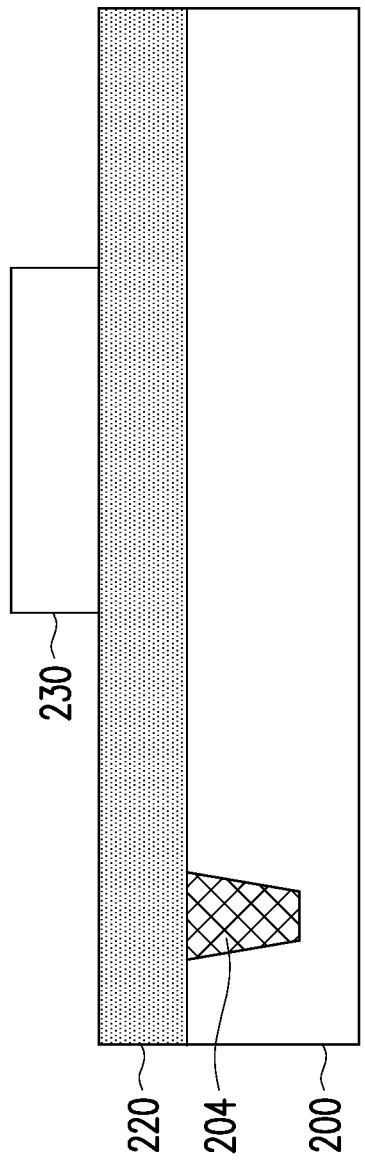

Next, in step 145, a first photoresist layer is deposited and patterned. As illustrated in FIG. 2E, the first photoresist layer 230 has been deposited upon the oxide film layer 220. A mask 236 is illustrated, which is used to expose the photoresist to patterned light. The photoresist is then developed to obtain a first patterned photoresist layer 230, as illustrated in FIG. 2F.

Figure 2G:
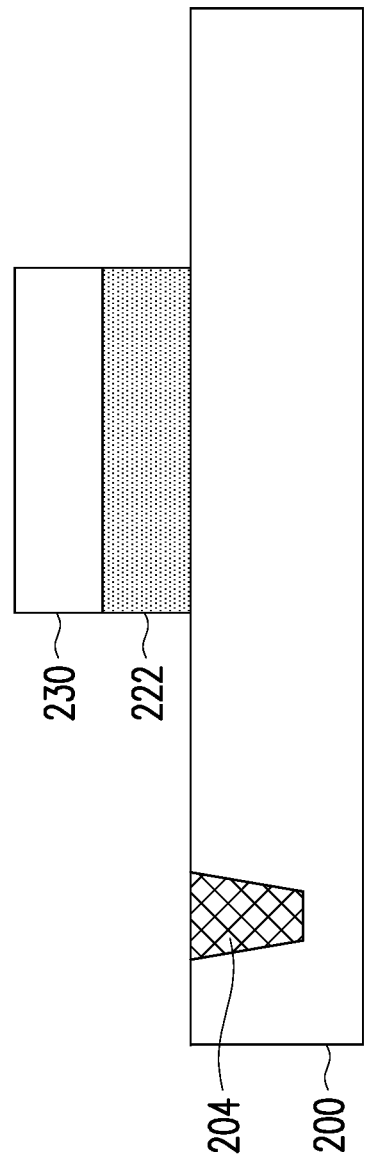

Next, in step 150 of FIG. 1, the oxide film layer 220 is etched to form a window 222. This is shown in FIG. 2G. The thickness 225 of the oxide film layer and the window may be, in some embodiments, from about 200 angstroms to about 1000 angstroms. The window 222 directly contacts the substrate 200.

Generally, any etching step used herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios.

For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$. In some embodiments, dry etching is performed first to reduce the thickness of the oxide film layer, and wet etching is subsequently performed. In step 155 of FIG. 1, the first patterned photoresist layer is then removed. FIG. 2H illustrates the result.

Next, in step 160, as illustrated in FIG. 2I, silicide junctions 240 are formed in the substrate on either side of the window 222 formed by the oxide film layer. These junctions will also operate as source/drain regions. In particular embodiments, the junctions are formed from a silicide, such as cobalt silicide ($CoSi_2$), titanium silicide ($TiSi_2$), nickel silicide ($NiSi_2$), platinum silicide ($PtSi_2$), or lead silicide ($Pb_2Si$), or other stoichiometric phases thereof.

In particular embodiments, the junctions are formed via ion implantation. Briefly, an ion implanter is used to implant atoms into a silicon crystal lattice, modifying the conductivity of the lattice in the implanted location. An ion implanter generally includes an ion source, a beam line, and a process chamber. The ion source produces the desired ions (here, for example, Co, Ti, Ni, Pt, or Pb). The beam line organizes the ions into a beam having high purity in terms of ion mass, energy, and species. The ion beam is then used to irradiate the semiconducting wafer substrate in a process chamber. The ion beam strikes the exposed regions on the wafer substrate, and the ions can be implanted into the substrate as dopants at desired depths. The oxide film layer is used as a mask to expose the substrate at desired locations for the junctions.

Alternatively, silicidation can be performed by blanket deposition of the metal, following by annealing in which the metal reacts with the underlying exposed silicon. Unreacted metal can then be removed, for example with a selective etch process.

The silicide junctions are then doped to obtain p-junctions and n-junctions. Common p-type dopants may include boron, gallium, or indium. Common n-type dopants may include phosphorus or arsenic. These dopants may also be applied via ion implantation.

In FIG. 2I, one p-junction 244 and two n-junctions 242 are illustrated. The p-junction 244 is on the far side of the STI region. The two n-junctions 242 are adjacent to the window 222, and are located on either side of the window. The photodiode is formed from the p-n junction. Upon irradiation by incident light, an electrical charge is induced in the photodiode. Not shown are other p-junctions which may form a separate photodiode with another n-junction. It is noted that multiple n-junctions 242 may be present adjacent the window 222, with each n-junction participating in a different photodiode. In other words, the window 222 may expose multiple photodiodes to incident light.

Figure 2J:
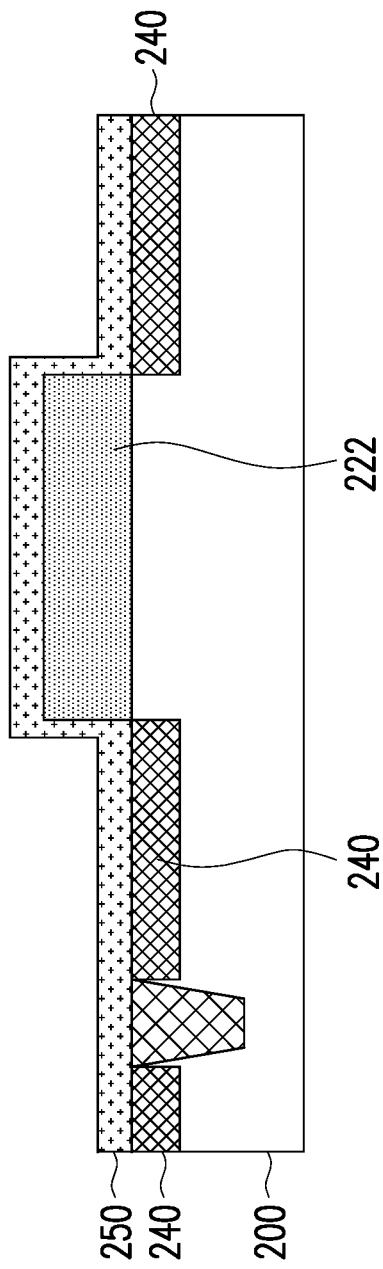

Continuing, in step 170 of FIG. 1, an etch stop layer 250 is deposited upon the substrate 200. As seen in FIG. 2J, the etch stop layer 250 covers the silicide junctions 240 and the window 222 formed from the oxide film layer. Typically, the etch stop layer is also an oxide, and in particular embodiments is the same material as the oxide film layer 220. For example, the etch stop layer can also be formed from a silicon oxide such as silicon dioxide.

In some particular embodiments, the etch stop layer is formed using sub-atmospheric pressure chemical vapor deposition (SACVD). A silicon-containing source gas acts as a silicon precursor, providing silicon for the reaction. Examples of such silicon precursors include but are not limited to tetraethyl orthosilicate (TEOS), trimethylsilane, tetramethylsilane, and hexachlorodisilane (HCDS). Ozone ($O_3$) is used to provide oxygen atoms for the reaction. At temperatures of about 300° C. to about 500° C. or higher, these gases will react to deposit silicon oxide.

Figure 2K:
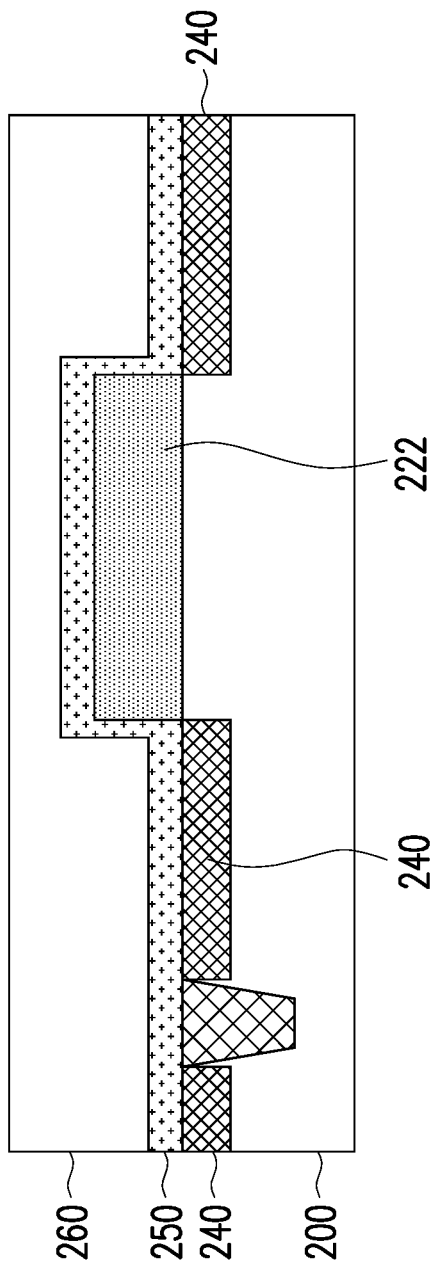
Figure 2L:
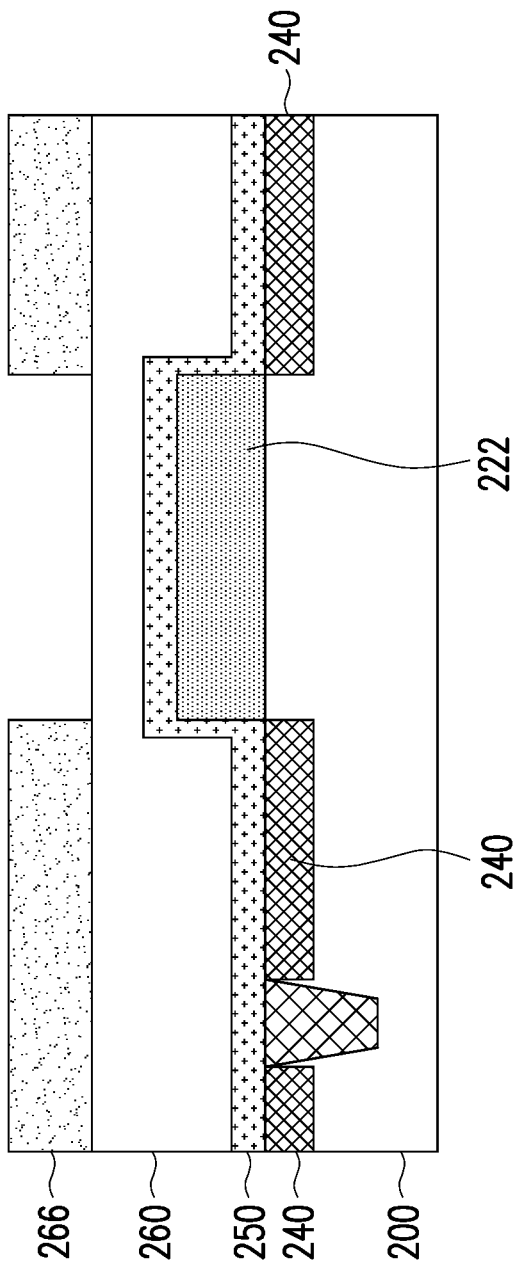
Figure 2Q:
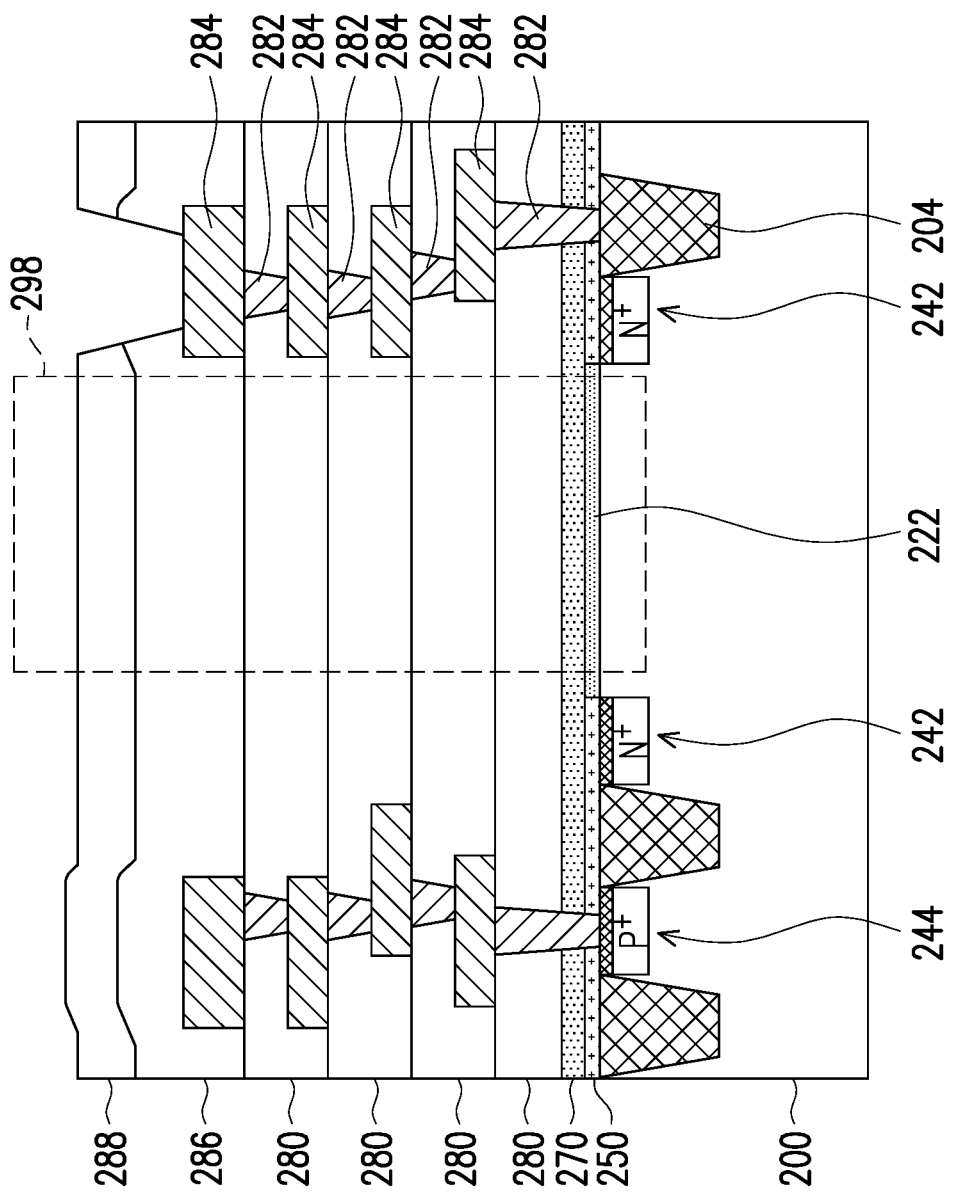

Next, in step 175, a second patterned photoresist layer is formed on the etch stop layer. As illustrated in FIG. 2K, a second photoresist layer 260 has been deposited upon the etch stop layer 250. Next, in FIG. 2L, a mask 266 is illustrated, which is used to expose the photoresist to patterned light. The photoresist is then developed to obtain a second patterned photoresist layer 260, as illustrated in FIG. 2M. As can be seen, the oxide film layer window 222 and the portion 254 of the etch stop layer above the window are now exposed.

It is noted that the etch stop layer 250 acts as a buffer to prevent the second photoresist layer from contacting the silicide junctions 240. This prevents the organic components of the photoresist from poisoning the silicide. In addition, this prevents the silicide from contaminating any wet etching tools. For example, if cobalt is exposed during wet etching, there is a risk of creating pits in the wafer substrate, which can reduce overall wafer yield.

Next, in step 180 and referring now to both FIG. 2M and FIG. 2N, etching is performed. In more particular embodiments, it is contemplated that the exposed portion of the etch stop layer 250 and the window 222 are wet etched, to reduce the thickness of the window. For example, this can be performed using hydrofluoric acid and ammonium fluoride. It is noted that the wet etching will generally be isotropic, and thus any vertical sidewall portions of the etch stop layer 250 will also be etched, but may not be completely etched away. For ease of explanation, such residual vertical portions are not illustrated.

The thickness of the etch stop layer 250 is indicated with reference numeral 255. In particular embodiments, the thickness 255 of the etch stop layer is from about 50 angstroms to about 200 angstroms. The thickness of the oxide film window 222 is indicated with reference numeral 225. In some embodiments, the etching is performed until the thickness 225 of the window is about equal to the thickness 255 of the etch stop layer. The timing of the wet etch can be used to control the final thickness of the window 222. In some other embodiments, the etching is performed until the difference between the thickness 225 of the window and the thickness 255 of the etch stop layer is about 300 angstroms or less. In some other embodiments, the etching is performed until the thickness 222 of the window is from about 50 angstroms to about 200 angstroms. The resulting structure is shown in FIG. 2N. Note that compared to FIG. 2M, the exposed portion 254 of the etch stop layer that was previously covering the oxide window 222 is completely etched away or removed.

In step 185 of FIG. 1, the second patterned photoresist layer is then removed. FIG. 2O shows the resulting structure. As illustrated here, the thickness 225 of the window is about equal to the thickness 255 of the etch stop layer.

In step 190, a nitride layer 270 is then deposited over the substrate 200. The nitride layer also covers the etch stop layer 250 and the oxide film window 222. The resulting photodiode structure is shown in FIG. 2P. The nitride layer may be formed using processes such as thermal oxidation, atomic layer deposition (ALD) or chemical vapor deposition (CVD). The nitride layer is formed, for example, from silicon nitride or from silicon oxynitride ($SiO_xN_y$). In particular embodiments, the thickness 275 of the nitride layer may be from about 150 angstroms to about 600 angstroms. It is noted that the presence of the etch stop layer 250 and oxide window 222 between the substrate 200 and the nitride layer 270 provides stress relief to the overall structure. If the nitride layer has direct contact with the substrate, detrimental effects such as wafer breakage or electrical path defects may occur.

The extinction coefficient and the refractive index of the window 222 and the nitride layer 270 can be controlled by varying the composition of the two layers and their relative thicknesses to obtain a desired quantum efficiency. The resulting structure has only two layers, the oxide window 222 and the nitride layer 270, which directly contact each other. No etch stop layer 250 is present between them. The two-layer combination is also thinner, and thus has improved light response because more light (particularly blue light) can pass through. Referring again to FIG. 2P, the total thickness of the oxide window 222 and the nitride layer 270 may range from about 200 angstroms to about 800 angstroms.

Following, and referring now to FIG. 2Q, in step 195, multi-level interconnects are formed. As shown here, interlayer dielectric (ILD) layers and intermetal dielectric (IMD) layers are then applied to the nitride layer 270. As illustrated here, an ILD layer 280 is formed upon the nitride layer 270. Vias 282 are then etched through the ILD layer 280, the nitride layer 270, and the etch stop layer 250 and filled with an electrically conductive material. Here, the vias 282 are illustrated as contacting a p-junction 244 and an STI region 204. Intermetal contacts 284 are formed at the top of each via 282. Additional dielectric material is deposited upon the intermetal contacts 284. These steps may be repeated to form the desired set of multi-level interconnects. Here, a total of four ILD/IMD layers 280 are illustrated. The vias and contacts may be made, for example, from aluminum, aluminum alloy, tungsten, or other conductive materials. The dielectric material used in the ILD/IMD layers may be any low-k dielectric material, such as for example undoped polysilicon, silicon oxide, silicon nitride, silicon oxynitride, phosphosilicate glass (PSG), borophosphosilicate glass (BPSG), spin-on glass (SOG), fluoride-doped silicate glass (FSG), carbon doped silicon oxide (SiCOH), polyimide, amorphous fluorinated carbon, bis-benzocyclobutenes (BCB), hydrogen silsesquioxane, fluorinated silicon oxide (SiOF), and/or combinations thereof. The ILD/IMD layers can be formed by PVD, CVD, ALD, oxidation, or other suitable deposition technique.

A passivation oxide layer 286 can be placed above the ILD/IMD layers, to reduce or prevent oxidation of the metals. The passivation oxide can be, for example, silicon oxide, $AlO_x$, $HfO_x$, $ZrO_x$, or other suitable material. The passivation oxide layer can be formed by PVD, CVD, ALD, oxidation, or other suitable deposition technique.

A passivation nitride layer 288 can also be placed above the passivation oxide layer 286 and/or the ILD/IMD layers 280. The passivation nitride can be, for example, silicon nitride or silicon oxynitride. The passivation nitride layer can be formed by PVD, CVD, ALD, oxidation, or other suitable deposition technique. As shown here, the two passivation layers can also be etched as appropriate to expose an electrical contact 284. The incident light path through these layers and down to the nitride layer 270 and the oxide window 222 is indicated with dashed box 298.

Figure 3:
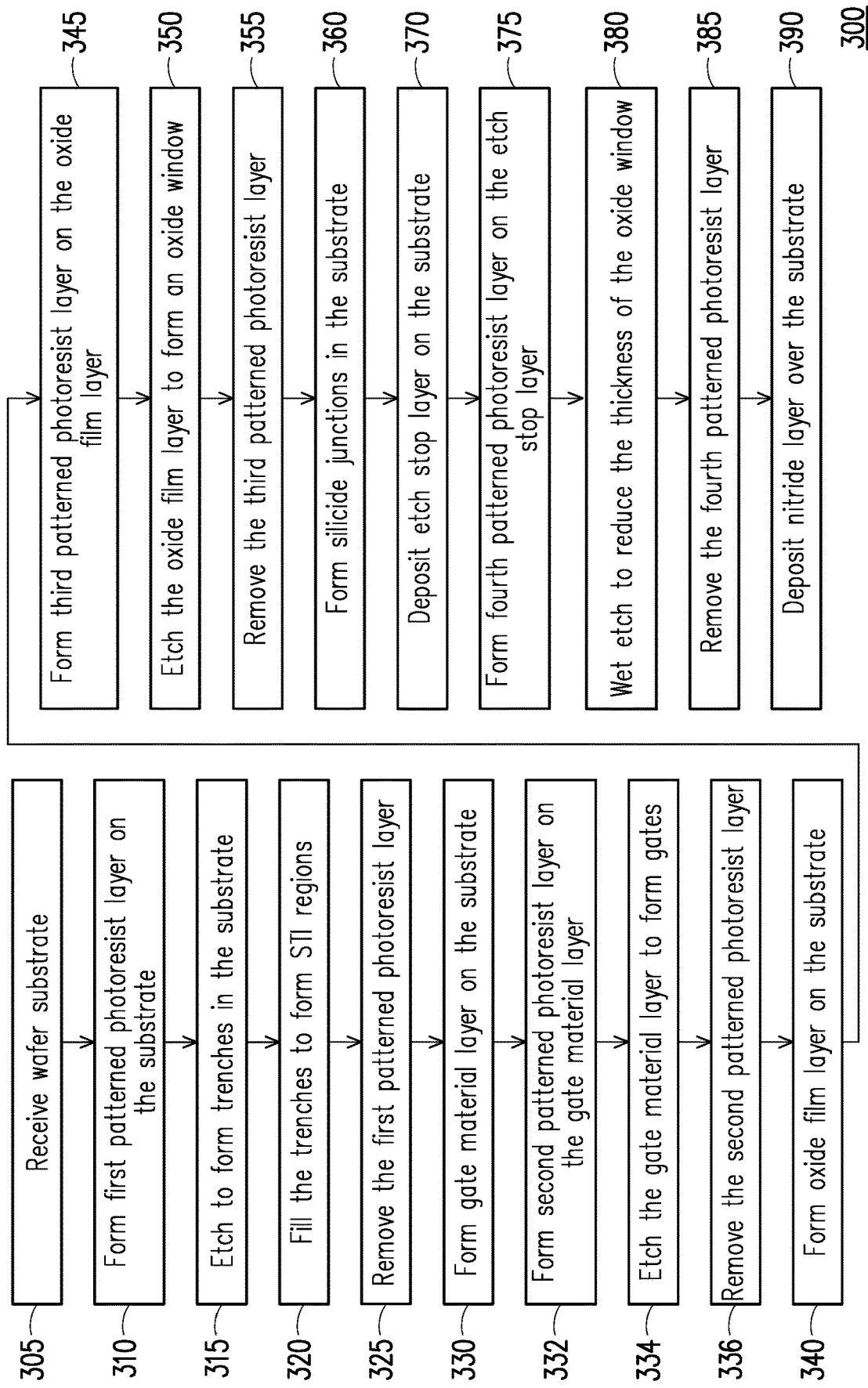
FIG. 3 is a flow chart illustrating a method for preparing a light sensor, illustrating the formation of both a logic area and a photodiode area, in accordance with some embodiments.

In a light sensor, the photodiode area of FIGS. 2A-2Q is joined to a logic area. The photodiode area and the logic area can be fabricated in the same process. FIG. 3 is a flow chart illustrating a method 300 for preparing these two areas of the light sensor. Some steps of the method are also illustrated in FIGS. 4A-4K. It should be noted that although they can be manufactured adjacent to each other and are illustrated in this manner, that these two areas are merely representative of the photodiode areas and logic areas formed throughout the light sensor. Thus, they can also be formed in separate areas that are not adjacent to each other.

Initially, as seen in FIG. 4A, and in step 305, a wafer substrate 200 is received or provided. For ease of explanation and for illustrative purposes, the substrate is divided into a logic area 206 on the left-hand side and a photodiode area 208 on the right-hand side Referring now to FIG. 3 and FIG. 4B, in step 310, a first photoresist layer is deposited, patterned, and developed to obtain a first patterned photoresist layer 230.

Next, in step 315, etching is performed through the first patterned photoresist layer down into the substrate 200 to form trenches. The substrate can be wet etched or dry etched, using suitable etchants. Then, in step 320, the trenches are filled with a dielectric material to form shallow trench isolation (STI) regions 204. In step 325, the first patterned photoresist layer is then removed. The resulting structure is illustrated in FIG. 4C, and is analogous to FIG. 2C.

In step 330, a gate material layer is formed on the substrate. The gate material may be, for example, polysilicon. This layer may be formed using processes such as thermal oxidation, atomic layer deposition (ALD) or chemical vapor deposition (CVD), including plasma-enhanced atomic layer deposition (PEALD) or plasma-enhanced chemical vapor deposition (PECVD).

In step 332, a second photoresist layer is deposited, patterned, and developed to obtain a second patterned photoresist layer. In step 334, etching is then performed to form gates from the gate material in the logic area 206 in desired locations. The polysilicon material is entirely removed from the photodiode area. In step 336, the second patterned photoresist layer is then removed.

In step 338, sidewall spacers may be formed adjacent the gates. This is done in a similar manner, by depositing and etching the spacer layer. The spacers may be made, for example from nitride or oxide. The resulting structure is illustrated in FIG. 4D. Two gates 292a, 292b are illustrated here with sidewall spacers 291.

In step 340, an oxide film layer is formed on the substrate. Then, in step 345, a third photoresist layer is deposited, patterned, and developed to obtain a third patterned photoresist layer. Next, in step 350 of FIG. 3, the oxide film layer is etched to form a window 222 in the photodiode area 208. The resulting structure is shown in FIG. 4E. If desired, the oxide film may also be maintained over a gate. In FIG. 4E, for example, the oxide film layer is removed from gate 292a, but the oxide film layer 220 is present over gate 292b. The thickness 225 of the oxide film layer and the window may be, in some embodiments, from about 200 angstroms to about 1000 angstroms.

Next, in step 360, as illustrated in FIG. 4F, p-junctions 244 and n-junctions 242 are formed in the substrate on either side of the window 222 formed by the oxide film layer in the photodiode area. Junctions are also formed in other locations in the photodiode area 208 and the logic area 206. These junctions can operate as source/drain regions. Again, in particular embodiments, the junctions are formed from a silicide, such as cobalt silicide ($CoSi_2$), titanium silicide ($TiSi_2$), nickel silicide ($NiSi_2$), platinum silicide ($PtSi_2$), or lead silicide ($Pb_2Si$), or other stoichiometric phases thereof. It is noted that a silicide layer 293 is also formed in the exposed gate 292a. In this regard, the silicide layer improves electrical conduction in the gate as well. Again, the silicide layers may be formed via ion implantation. The silicide layers are then doped with suitable dopants to form p-junctions and n-junctions.

Figure 4G:
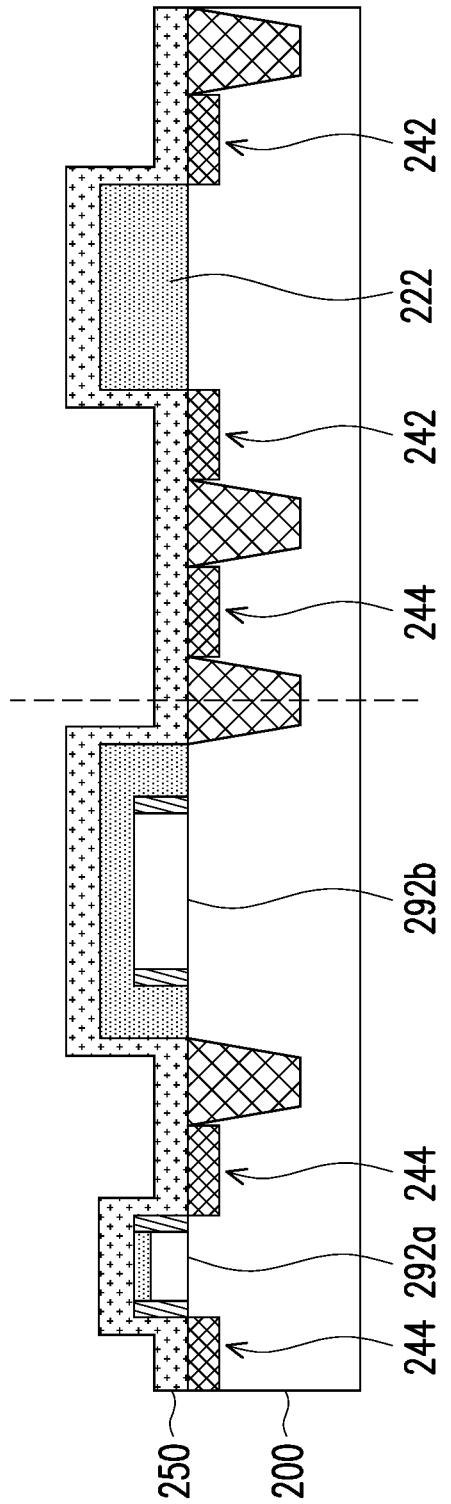

Continuing, in step 370 of FIG. 3, an etch stop layer 250 is deposited upon the substrate 200. As seen in FIG. 4G, the etch stop layer 250 covers the silicide junctions 242, 244, the gates 292a, 292b, the STI regions 204, and the window 222 in the photodiode area. The etch stop layer is also an oxide, and in particular embodiments is the same material as the oxide window 222.

Figure 4H:
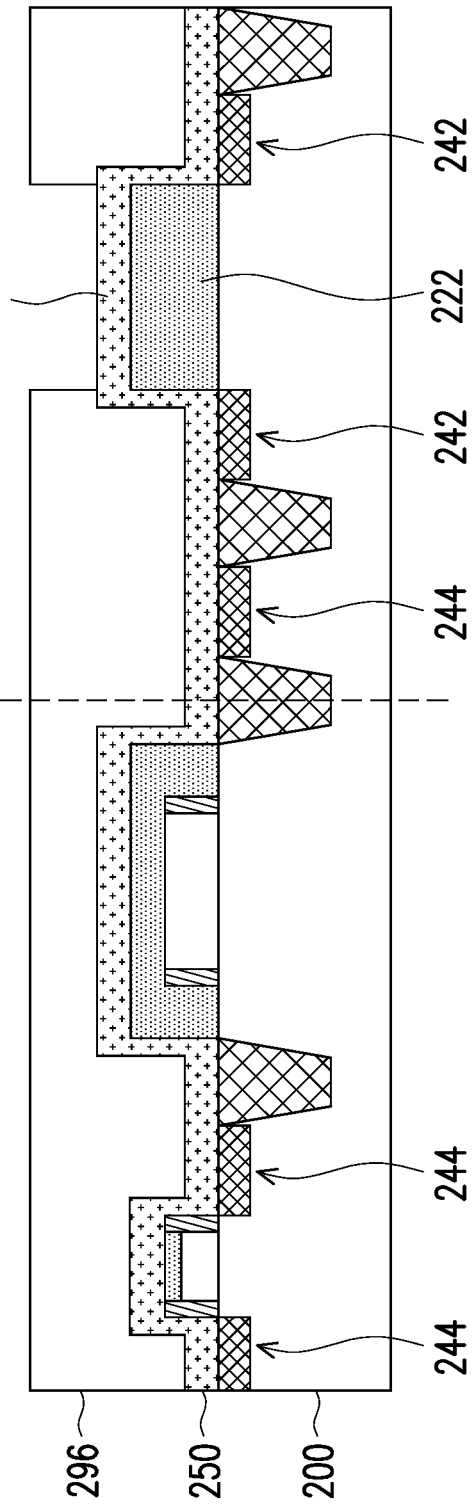

Next, in step 375, a fourth photoresist layer 296 is deposited, patterned, and developed. As illustrated in FIG. 4H, the oxide film layer window 222 and the portion 254 of the etch stop layer 250 above the window in the photodiode area are now exposed.

Next, in step 380, wet etching is performed. As a result, the exposed portion 254 of the etch stop layer and the window 222 are wet etched. The etching is performed until a desired thickness 225 of the window is attained. The resulting structure is shown in FIG. 4I. Again, the exposed portion 254 of the etch stop layer that was previously covering the oxide window 222 is completely etched away or removed.

In step 385 of FIG. 3, the fourth patterned photoresist layer is then removed. FIG. 4J illustrates the result.

Figure 4K:
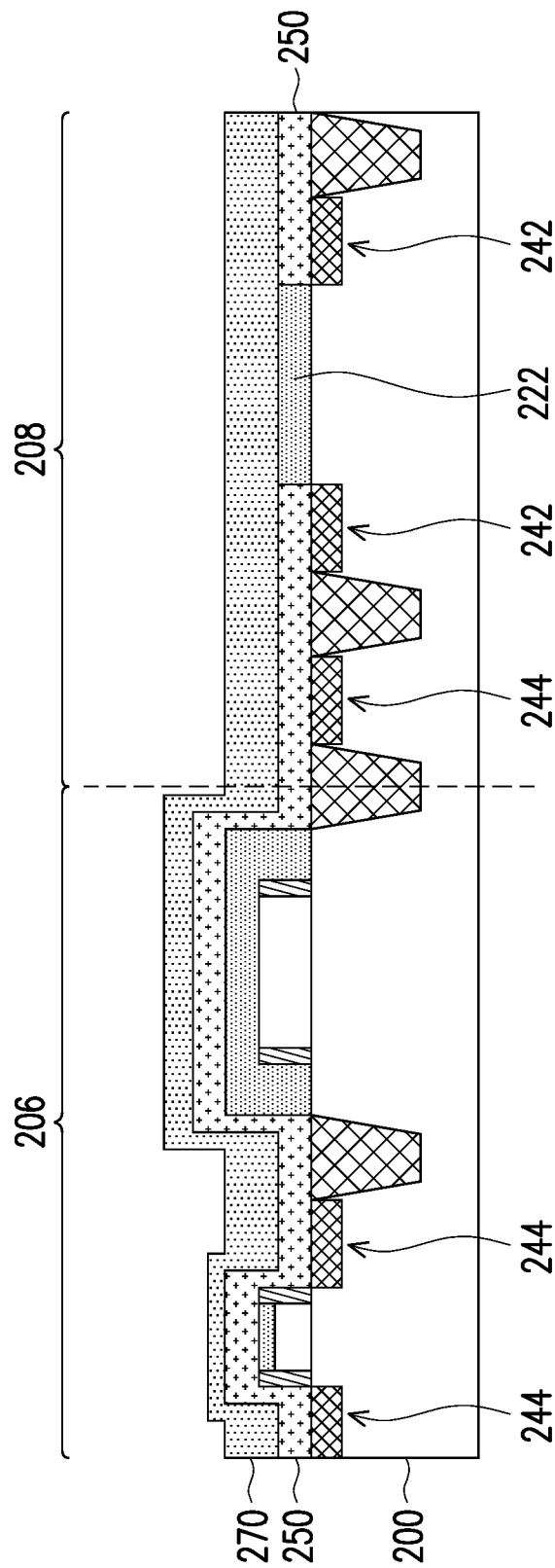

In step 390, a nitride layer 270 is then deposited over the substrate 200. The nitride layer covers the logic area 208 as well as the etch stop layer 250 and the oxide film window 222 in the photodiode area 206. The resulting photodiode structure is shown in FIG. 4K. Again, the nitride layer is formed, for example, from silicon nitride or from silicon oxynitride ($SiO_xN_y$). In particular embodiments, the thickness 275 of the nitride layer may be from about 150 angstroms to about 600 angstroms.

Figure 5:
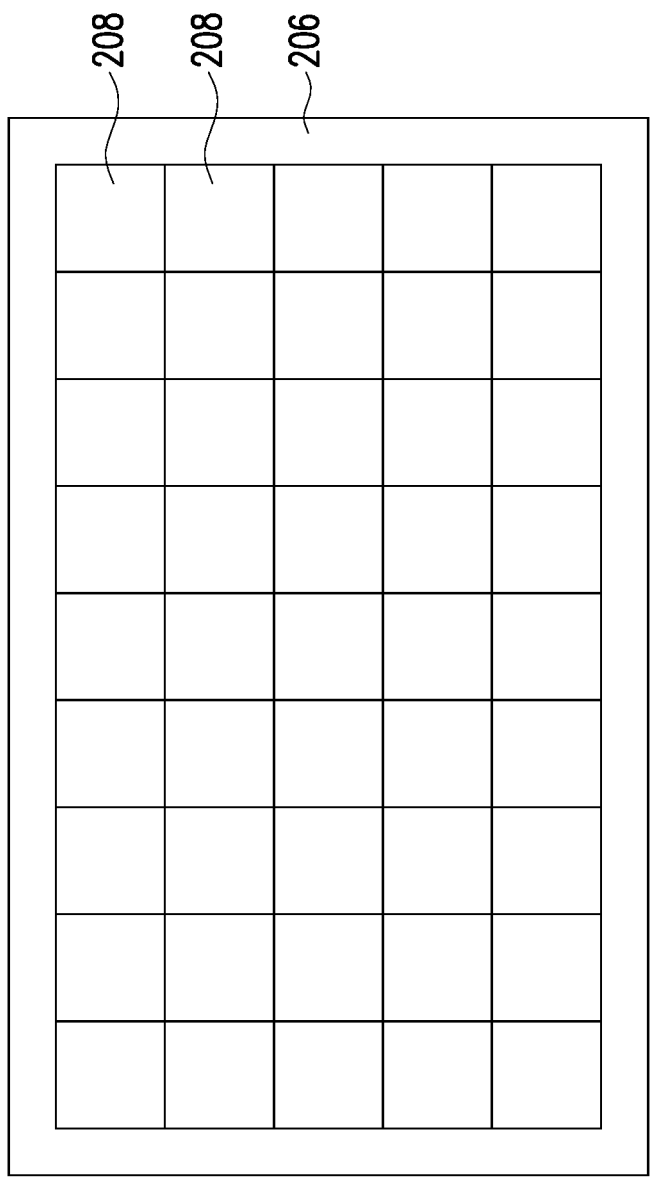
FIG. 5 is a plan view schematic of the light sensor or image sensor.

As previously discussed, more than one photodiode area can be connected to the same logic area. FIG. 4K only shows one photodiode area, and the same processes can be applied to produce multiple photodiode areas for one logic area when a three-dimensional area is considered. For example, as illustrated in the plan view of FIG. 5, the light sensor 500 can have a plurality of photodiode areas 208 connected to a single logic area 206. Each photodiode area can also include circuitry for connecting the photodiode area to the logic area. For example, a transistor can be coupled to a photodiode area to sample the charge of the photodiode area. The thickness of the nitride layer 270 and the oxide window 222 can vary between the different photodiode areas, which would permit additional transmittance/reflectivity adjustments for different light wavelengths. The light sensor may be illuminated from the front side or the back side. The logic area can also include other circuitry for processing the various signals from the photodiode areas. Each photodiode area may also include a color filter (not shown) and a lens for focusing incident light into the window.

The resulting structure in the photodiode area has improved blue light response, due to the reduced thickness of the oxide window 222 and the nitride layer 270. Incident light only needs to pass through these two layers. Referring again to FIG. 2P, the total thickness of the oxide window 222 and the nitride layer 270 may range from about 200 angstroms to about 800 angstroms.

Figure 6:
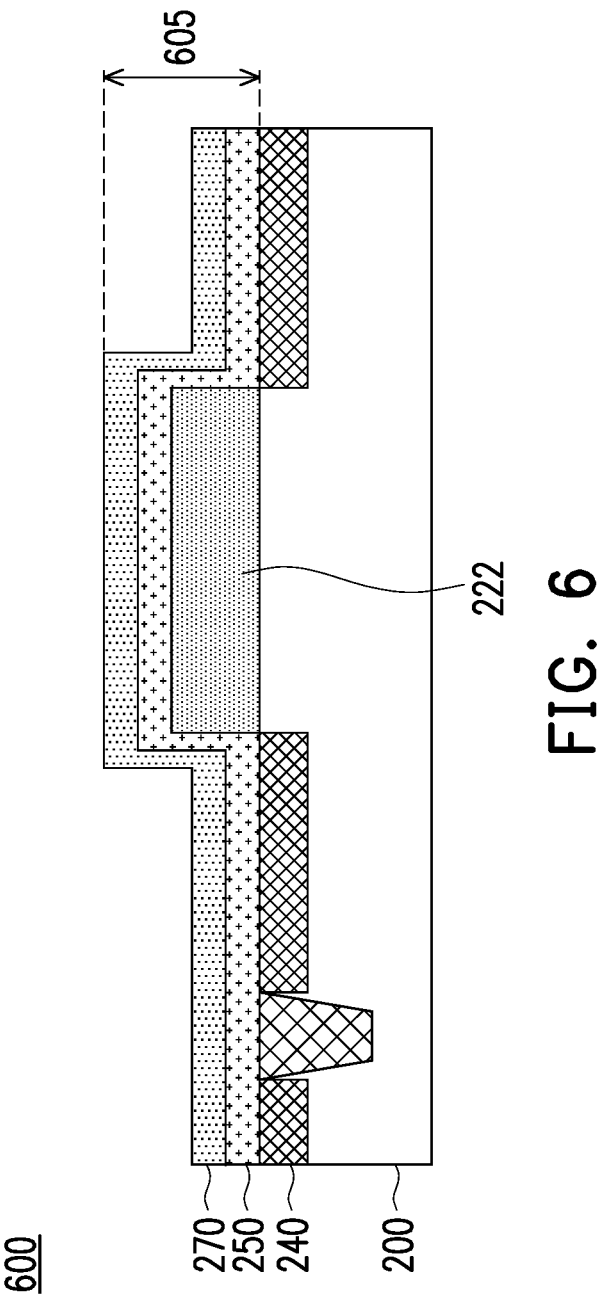
FIG. 6 is a cross-sectional view of a conventional photodiode structure, for comparative purposes.

By way of comparison, FIG. 6 shows a conventional photodiode structure 600. Between the two n-junctions, three layers are present: the oxide window 222, the etch stop layer 250, and the nitride layer 270. These three layers have a total thickness 605 of about 1800 angstroms. While the thickness does not have large effect on the transmission and reflectivity of red light and green light, the thickness has a large effect on blue light.

Because of the improved light response, the total area for each photodiode can be reduced if desired while still obtaining the same performance. In addition, the etching process uses an already-existing mask, so no additional costs are required for an additional mask. The etch stop layer prevents photoresist pollution from occurring as well.

Some embodiments of the present disclosure thus relate to methods for improving spectrum response in a photodiode area. An oxide window is formed on a substrate. At least one terminal is formed on a side of the oxide window. An etch stop layer is deposited over the at least one terminal. The oxide window is then etched until a thickness of the oxide window and a thickness of the etch stop layer are about equal. In some particular embodiments, the thicknesses of the oxide window and the etch stop layer are from about 50 angstroms to about 200 angstroms. A nitride layer is then deposited over the etch stop layer and the oxide window. The nitride layer directly contacts the oxide window.

Other embodiments of the present disclosure relate to alternative methods for improving spectrum response in a photodiode area. An oxide film layer is formed on a substrate. A first patterned photoresist layer is formed. The oxide film layer is then etched through the mask to form a window. The first patterned photoresist layer is removed. Terminals are formed in the substrate. An etch stop layer is deposited on the substrate. A second patterned photoresist layer is formed that exposes a portion of the etch stop layer over the window. Wet etching is performed to reduce the thickness of the window. In some specific embodiments, the etch stop layer over the terminals and the window have a thickness within about 300 angstroms of each other. Desirably, the window has a thickness of about 50 angstroms to about 200 angstroms. The second patterned photoresist layer is then removed. A nitride layer is then deposited on the substrate and directly contacts the window.

Still other embodiments of the present disclosure relate to methods for preparing a light sensor. Shallow trench isolation (STI) regions are formed in a substrate. A gate is formed in a logic area of the substrate. An oxide film layer is formed on the substrate and over the gate. The oxide film layer is etched to form a window in a photodiode area of the substrate and to expose the substrate. Silicide junctions are formed in the exposed substrate by ion implantation. An etch stop oxide layer is deposited on the substrate to cover the silicide junctions. A patterned photoresist layer is formed on the substrate. The photodiode area is wet etched to reduce the thickness of the window. In particular embodiments, the resulting window (after wet etching) has a thickness of about 50 angstroms to about 200 angstroms. A nitride layer is then deposited over the substrate and directly contacts the window.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for improving spectrum response in a photodiode area, comprising:
    forming an oxide window on a substrate;
    forming at least one terminal on a side of the oxide window;
    depositing an etch stop layer over the at least one terminal;
    etching the oxide window until a thickness of the oxide window and a thickness of the etch stop layer are about equal; and
    depositing a nitride layer over the etch stop layer and the oxide window, wherein the nitride layer directly contacts the oxide window.

2. The method of claim 1, wherein the at least one terminal is formed from a silicide.

3. The method of claim 2, wherein the silicide is cobalt silicide, titanium silicide, nickel silicide, platinum silicide, or lead silicide.

4. The method of claim 1, wherein the at least one terminal is formed using ion implantation.

5. The method of claim 1, wherein the etch stop layer and the oxide window are formed from the same material.

6. The method of claim 1, wherein the nitride layer is formed from silicon nitride or silicon oxynitride.

7. The method of claim 1, wherein the oxide window has a thickness of about 50 angstroms to about 200 angstroms.

8. The method of claim 1, wherein the nitride layer in the photodiode area has a thickness of about 150 angstroms to about 600 angstroms.

9. The method of claim 1, wherein the at least one terminal is an n-junction, and a p-junction is also formed on the opposite side of an STI region to form a photodiode.

10. A method for improving spectrum response in a photodiode area, comprising:
    forming an oxide film layer on a substrate;
    forming a first patterned photoresist layer;
    etching the oxide film layer to form a window;
    removing the first patterned photoresist layer;
    forming terminals in the substrate;
    depositing an etch stop layer on the substrate;
    forming a second patterned photoresist layer that exposes a portion of the etch stop layer over the window;
    wet etching the window;
    removing the second patterned photoresist layer; and
    depositing a nitride layer on the substrate, the nitride layer directly contacting the window.

11. The method of claim 10, wherein the terminals include a p-junction and an n-junction that form a photodiode.

12. The method of claim 10, wherein the terminals are formed from a silicide.

13. The method of claim 12, wherein the silicide is cobalt silicide, titanium silicide, nickel silicide, platinum silicide, or lead silicide.

14. The method of claim 10, wherein the etch stop layer and the window have a thickness within about 300 angstroms of each other after the wet etching.

15. The method of claim 10, wherein the window has a thickness of about 50 angstroms to about 200 angstroms.

16. The method of claim 10, wherein the nitride layer has a thickness of about 150 angstroms to about 600 angstroms.

17. A method for preparing a light sensor, comprising:
    forming shallow trench isolation (STI) regions in a substrate;
    forming a gate in a logic area of the substrate;
    forming an oxide film layer on the substrate and over the gate;
    etching the oxide film layer to form a window in a photodiode area of the substrate and to expose the substrate;
    implanting ions to form silicide junctions in the exposed substrate;
    depositing an etch stop oxide layer on the substrate to cover the silicide junctions;
    forming a patterned photoresist layer on the substrate;
    wet etching the photodiode area to reduce a thickness of the window; and
    depositing a nitride layer over the substrate, the nitride layer directly contacting the window.

18. The method of claim 17, wherein the implanted ions are cobalt, titanium, nickel, platinum, or lead.

19. The method of claim 17, wherein the etch stop oxide layer and the window are both formed from a silicon oxide.

20. The method of claim 17, wherein the nitride layer and the window have a total thickness of about 200 angstroms to about 800 angstroms.

* * * * *